(12) United States Patent
Tung et al.

(10) Patent No.: US 11,462,454 B2
(45) Date of Patent: *Oct. 4, 2022

(54) SEMICONDUCTOR PACKAGE COMPRISING HEAT SPREADER AND MANUFACTURING METHOD THEREOF

(71) Applicant: Orient Semiconductor Electronics, Limited, Kaohsiung (TW)

(72) Inventors: Yueh-Ming Tung, Kaohsiung (TW); Chia-Ming Yang, Kaohsiung (TW); Jung-Wei Chen, Kaohsiung (TW); Jian-De Leu, Kaohsiung (TW); Guan-Lin Pan, Kaohsiung (TW)

(73) Assignee: ORIENT SEMICONDUCTOR ELECTRONICS, LIMITED, Kaohsiung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/158,386

(22) Filed: Jan. 26, 2021

(65) Prior Publication Data
US 2022/0189842 A1 Jun. 16, 2022

(30) Foreign Application Priority Data
Dec. 15, 2020 (TW) ................. 109144310

(51) Int. Cl.
| | |
|---|---|
| *H01L 23/36* | (2006.01) |
| *H01L 23/31* | (2006.01) |
| *H01L 23/538* | (2006.01) |
| *H01L 23/00* | (2006.01) |
| *H01L 21/50* | (2006.01) |

(52) U.S. Cl.
CPC .............. *H01L 23/36* (2013.01); *H01L 21/50* (2013.01); *H01L 23/31* (2013.01); *H01L 23/5384* (2013.01); *H01L 23/5385* (2013.01); *H01L 24/11* (2013.01); *H01L 24/14* (2013.01)

(58) Field of Classification Search
CPC ..... H01L 23/36; H01L 23/31; H01L 23/5384; H01L 23/5385; H01L 21/50; H01L 24/11; H01L 24/14
USPC ....................................................... 257/706
See application file for complete search history.

(56) References Cited

U.S. PATENT DOCUMENTS

| | | | |
|---|---|---|---|
| 11,355,356 B1 * | 6/2022 | Tung ................. | H01L 21/56 |
| 2013/0016478 A1 * | 1/2013 | Gagnieux ............. | H01L 24/73 |
| | | | 29/841 |

(Continued)

FOREIGN PATENT DOCUMENTS

| | | |
|---|---|---|
| TW | 200516743 A | 5/2005 |
| TW | 201923998 A | 6/2019 |

(Continued)

*Primary Examiner* — Quoc D Hoang
(74) *Attorney, Agent, or Firm* — WPAT, PC

(57) ABSTRACT

The present disclosure provides a semiconductor package. The semiconductor package includes a redistribution layer, a die, a heat spreader, a thermal interface material and a molding layer. The die is disposed on the redistribution layer. The heat spreader is disposed on the die. The thermal interface material is applied between the heat spreader and the die. The molding layer is formed on the redistribution layer to enclose the die. The present disclosure further provides a method of manufacturing the above semiconductor package.

6 Claims, 5 Drawing Sheets

(56) References Cited

U.S. PATENT DOCUMENTS

2019/0148262 A1  5/2019  Pei et al.
2020/0211975 A1* 7/2020  Dhakal ................ H01L 21/561

FOREIGN PATENT DOCUMENTS

TW      M597984 U      7/2020
WO      2019/179184 A1 9/2019

* cited by examiner

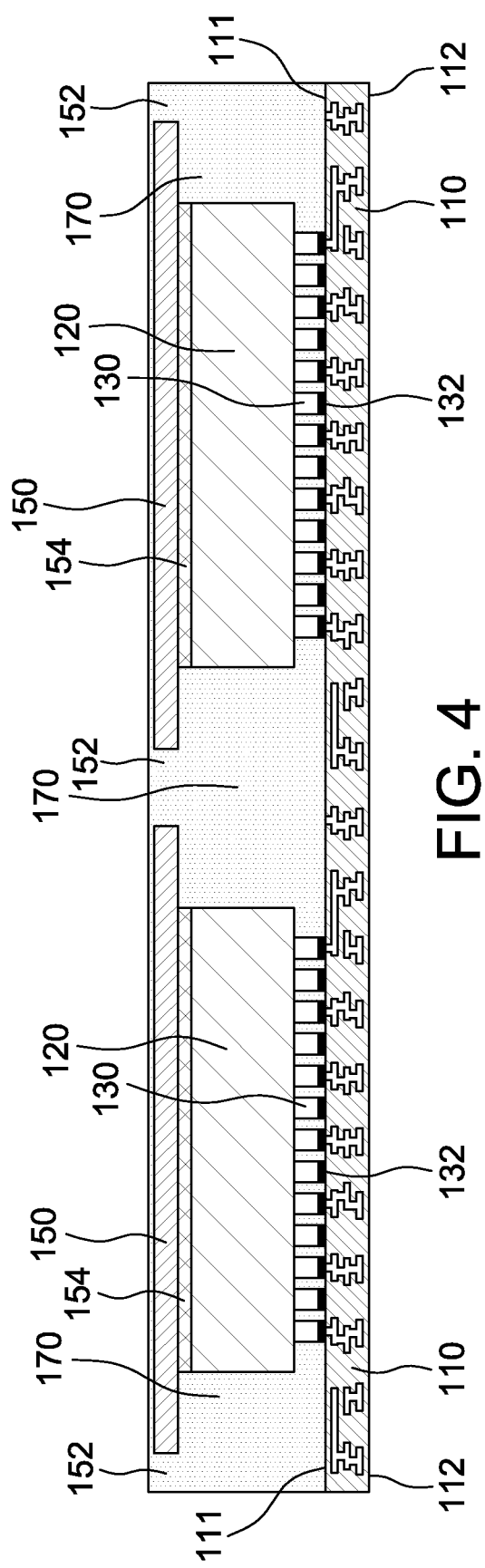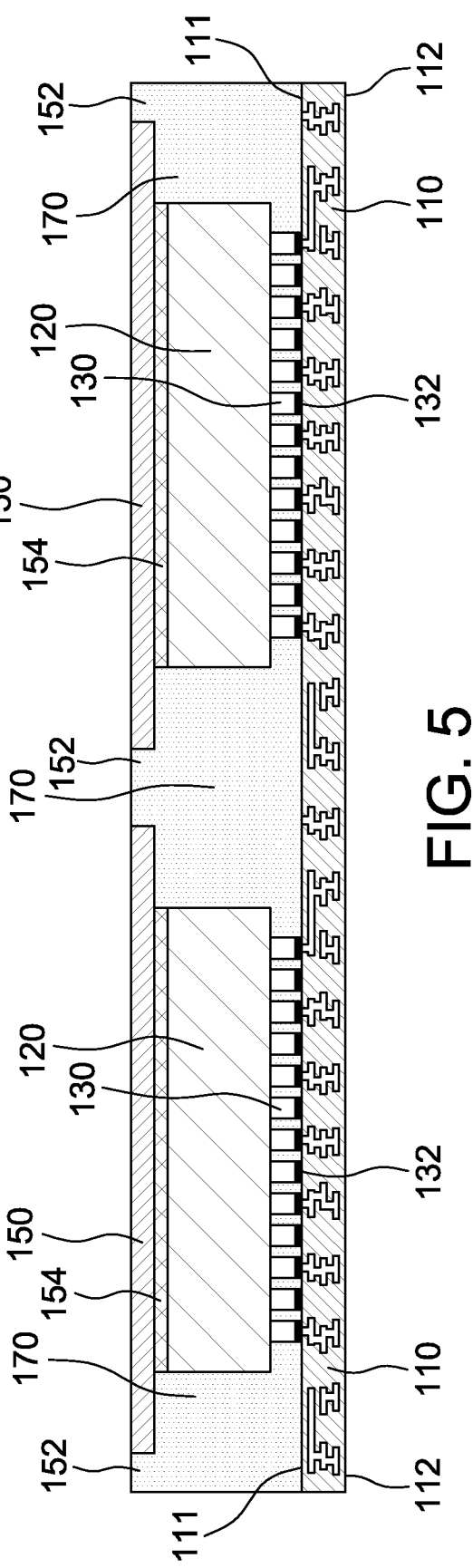

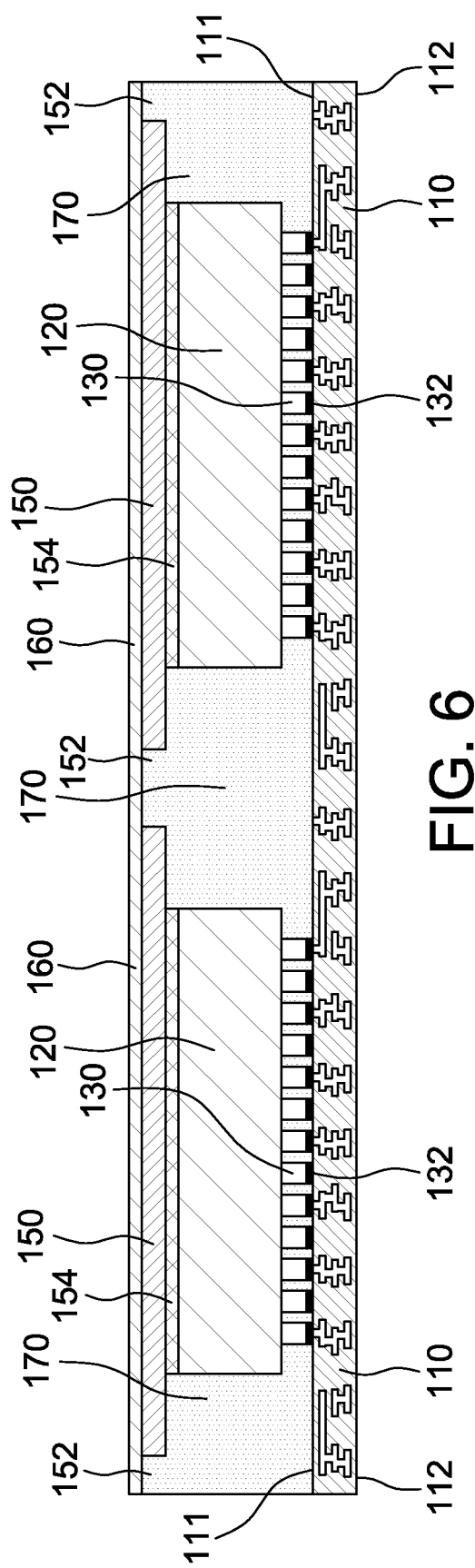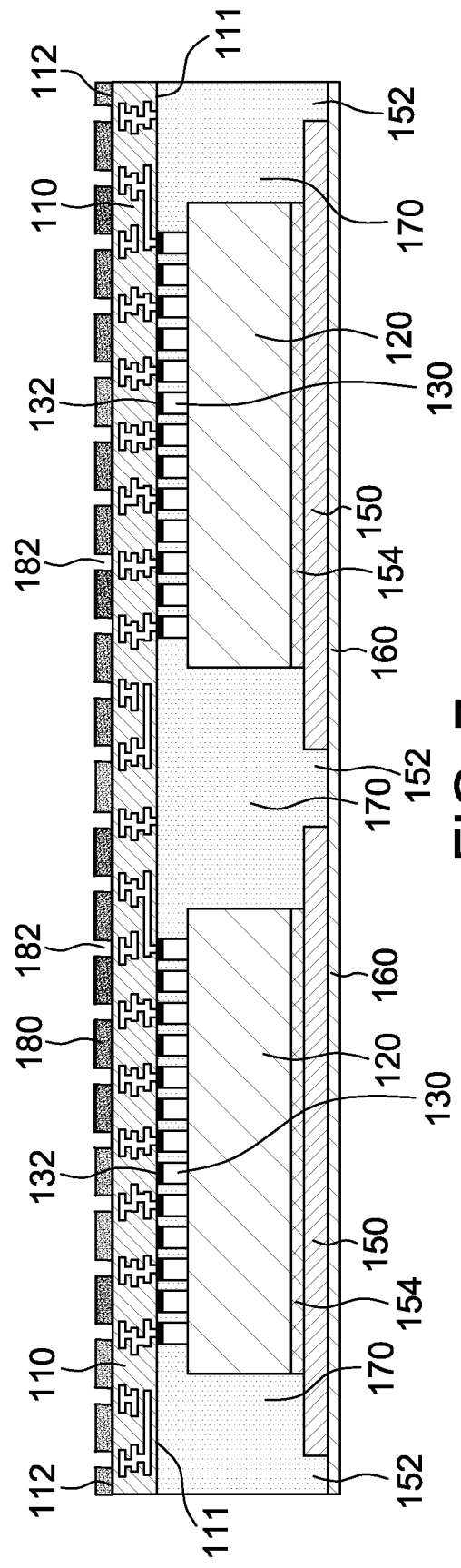

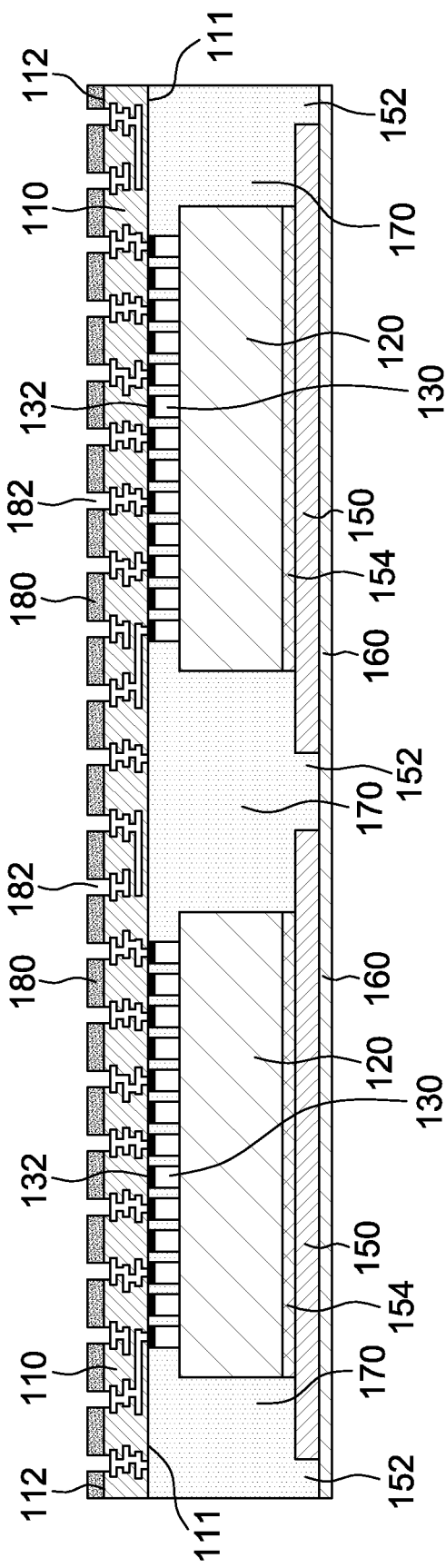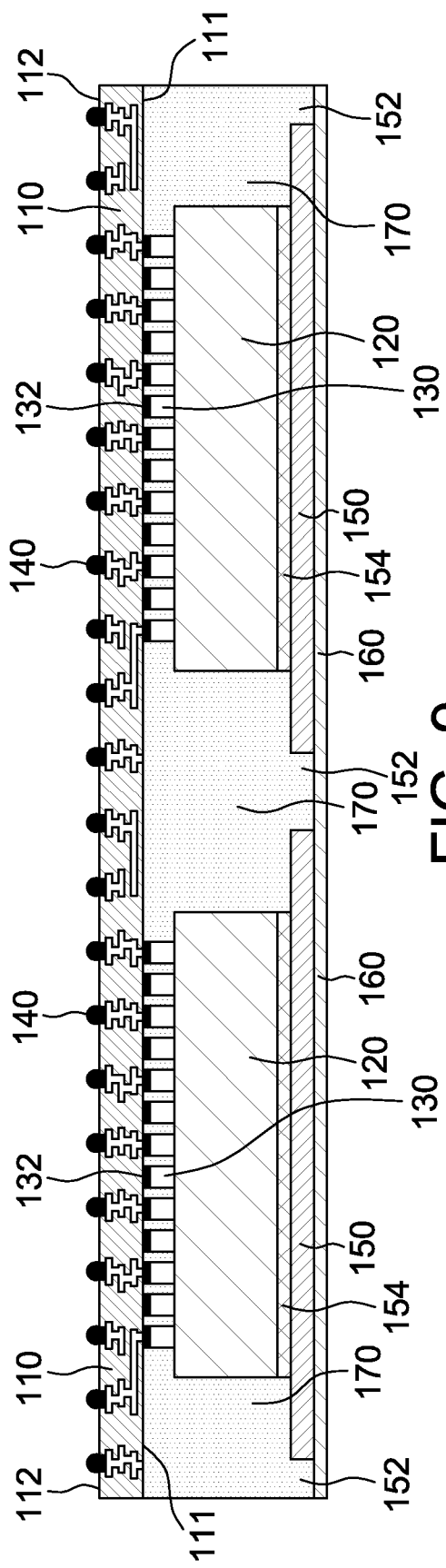

SEMICONDUCTOR PACKAGE COMPRISING HEAT SPREADER AND MANUFACTURING METHOD THEREOF

RELATED APPLICATION

The present application is based on and claims priority to Taiwanese Application Number 109144310, filed Dec. 15, 2020, the disclosure of which is hereby incorporated by reference herein in its entirety.

BACKGROUND

Technical Field

This disclosure relates to a semiconductor package and a manufacturing method thereof, and more particularly relates to a semiconductor package having a heat spreader, and a manufacturing method thereof.

Description of the Related Art

Nowadays, the demand for technology and consumer electronic products is moving towards higher levels. With the demand for more sophisticated and smaller chips and packaging, the development of semiconductors towards fan-out packaging is an inevitable path.

In the current fan-out package with a heat spreader, the heat spreader is always attached to the molding material that seals the die. When the heat generated by the die needs to be dissipated, it is first transferred to the molding material and then to the heat spreader before it dissipates. This reduces the efficiency of heat dissipation.

Furthermore, dry/wet processes need to be used to form a fan-out semiconductor package. However, the dry/wet processes will adversely affect the conductive traces embedded in the redistribution layer in the fan-out semiconductor package. In order to protect the conductive traces in the redistribution layer from damage during process, a protective layer will be laid on a temporary carrier before processing. Therefore, the protective layer needs to be removed before the conductive bumps are bonded to the structure.

The existing method of removing the protective layer on the redistribution layer is to use a laser to remove it. However, the area that needs to be cleared varies depending on the structure. In the case of high cleaning demand, the laser removal operation will take more time to complete.

SUMMARY

In view of the above, the present disclosure provides a semiconductor package and a manufacturing method thereof that has higher heat dissipation efficiency and may quickly remove the protective layer on the redistribution layer.

In one embodiment, the semiconductor package of the present disclosure includes a redistribution layer, a die, a heat spreader, a thermal interface material and a molding layer. The die is disposed on the redistribution layer. The heat spreader is disposed on the die. The thermal interface material is applied between the heat spreader and the die. The molding layer is formed on the redistribution layer to enclose the die.

In one embodiment, the method of manufacturing a semiconductor package comprises: providing a redistribution layer having opposing first surface and second surface; disposing a die on the first surface of the redistribution layer and electrically connecting the die to the redistribution layer; applying a thermal interface material on the die; disposing a heat spreader on the die such that the thermal interface material is positioned between the heat spreader and the die; and forming a molding layer, with a molding material, on the redistribution layer to cover side surfaces of the die.

In the semiconductor package of the present disclosure, the heat spreader is directly attached to the die through the thermal interface material. Compared with the existing fan-out package where the heat spreader is directly attached to the molding material, the semiconductor package of the present disclosure is more capable of dissipating the heat generated by the die on the redistribution layer and therefore has better heat dissipation efficiency.

The foregoing, as well as additional objects, features and advantages of the disclosure will be more readily apparent from the following detailed description, which proceeds with reference to the accompanying drawings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 to 9 illustrate the method of manufacturing the semiconductor package of FIG. 1.

DETAILED DESCRIPTION OF THE PREFERRED EMBODIMENT

Figure 1:
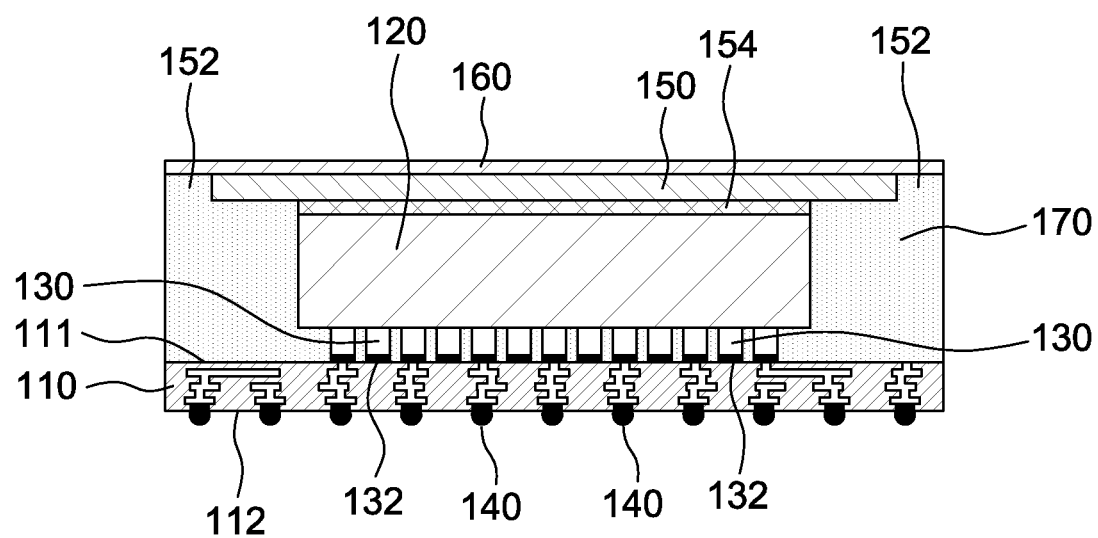
FIG. 1 is a schematic diagram of the semiconductor package of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatial relative terms, such as "beneath," "below," "lower," "above," "upper" and the like, may be used herein for ease of description to describe one element or feature's relationship to another element(s) or feature(s) as illustrated in the figures. The spatial relative terms are intended to encompass different orientations of the device in use or operation in addition to the orientation depicted in the figures. The apparatus may be otherwise oriented (rotated 90 degrees or at other orientations) and the spatial relative descriptors used herein may likewise be interpreted accordingly.

Referring to FIG. 1, the semiconductor package of the present disclosure includes a redistribution layer (RDL) 110 in which conductive traces are disposed. The redistribution layer 110 has opposing first surface 111 and second surface 112, and the first surface 111 and the second surface 112 are located on different planes. For example, the first surface 111 is a top surface and the second surface 112 is a bottom surface, but is not limited thereto. A plurality of conductive bumps 140 are provided on the second surface 112 of the redistribution layer 110. The conductive bumps 140 are electrically connected to the redistribution layer 110. A die 120 is disposed on the first surface 111 of the redistribution layer 110. The die 120 has opposing first surface and second surface, wherein the second surface is an active surface and faces the first surface 111 of the redistribution layer 110. The die 120 is electrically connected to the redistribution layer 110 in a flip-chip manner. More specifically, a plurality of conductive pillars 130 is coupled to the active surface of the die 120. The conductive pillars 130 are fixed on the first surface 111 of the redistribution layer 110 by solder bumps 132 so that the die 120 is capable of electrically connecting to the redistribution layer 110. The die 120 is further electrically connected to an external circuit through the conductive bumps 140.

A heat spreader 150 is provided on the first surface of the die 120. The heat spreader 150 is polygonal and has opposing first surface and second surface, wherein the second surface of the heat spreader 150 faces the first surface of the die 120. In one embodiment, the heat spreader 150 extends beyond the periphery of the die 120. In another embodiment, the heat spreader 150 is provided with a plurality of through holes 152 formed thereon. The heat spreader 150 is connected to the first surface of the die 120 with a thermal interface material 154, and the thermal interface material 154 is in direct contact with the heat spreader 150 and the die 120. A metal layer 160 is coated on the first surface, i.e. outer surface of the heat spreader 150.

A molding layer 170 is formed on the first surface 111 of the redistribution layer 110. The molding layer 170 is made of a molding material, such as an epoxy resin, but is not limited thereto. The molding layer 170 is further formed between the heat spreader 150 and the redistribution layer 110, and covers the side surfaces of the die 120. The molding layer 170 is filled in the through holes 152 on the heat spreader 150.

In the semiconductor package of the present disclosure, the thermal interface material 154 is used to connect the heat spreader 150 to the die 120. The molding layer 170 is formed to encapsulate the die 120 on the redistribution layer 110 by molding process so that the overall structure of the semiconductor package may stay stable. Since the molding layer 170 is formed by molding process, it will also be molded on the first surface of the heat spreader 150 in the molding process. Therefore, a grinding process is subsequently performed to remove the excess molding material to expose the first surface of the heat spreader 150 so that the heat spreader 150 may better dissipate the heat generated by the die 120. The metal layer 160 coated on the first surface of the heat spreader 150 serves as a protective layer to protect the heat spreader 150 from rust. The molding layer 170 is filled in the through holes 152 to make the heat spreader 150 adhere to the die 120 more firmly.

In the semiconductor package of the present disclosure, the heat spreader 150 is directly attached to the die 120 through the thermal interface material 154. Compared with the existing fan-out package where the heat spreader is directly attached to the molding material, the semiconductor package of the present disclosure is more capable of dissipating the heat generated by the die 120 on the redistribution layer 110 and therefore has better heat dissipation efficiency.

Figure 2:
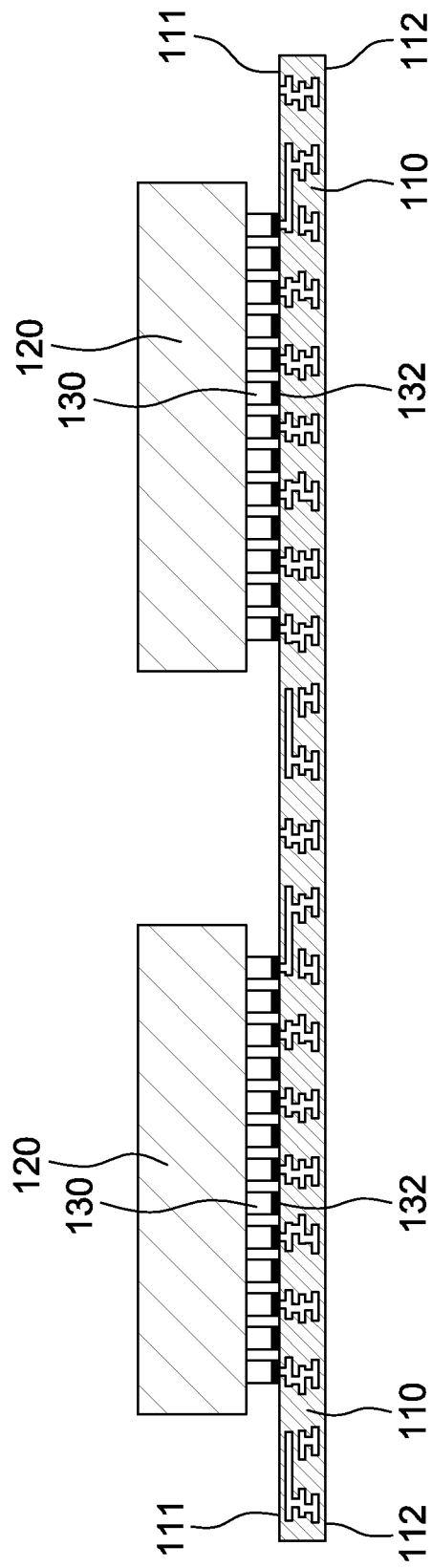

FIGS. 2 to 9 show a method of manufacturing the semiconductor package of FIG. 1. Referring to FIG. 2, a redistribution layer (RDL) 110 is provided. The redistribution layer 110 has opposing first surface 111 and second surface 112. A plurality of dies 120 is disposed on the first surface 111 of the redistribution layer 110 in a flip-chip manner, but is not limited thereto. The dies 120 respectively have opposing first surfaces and second surfaces, wherein the second surfaces are active surfaces. A plurality of conductive pillars 130 is coupled to the active surfaces of the dies 120. The conductive pillars 130 are fixed on the first surface 111 of the redistribution layer 110 by solder bumps 132 so that the dies 120 are capable of electrically connecting to the redistribution layer 110.

Figure 3:
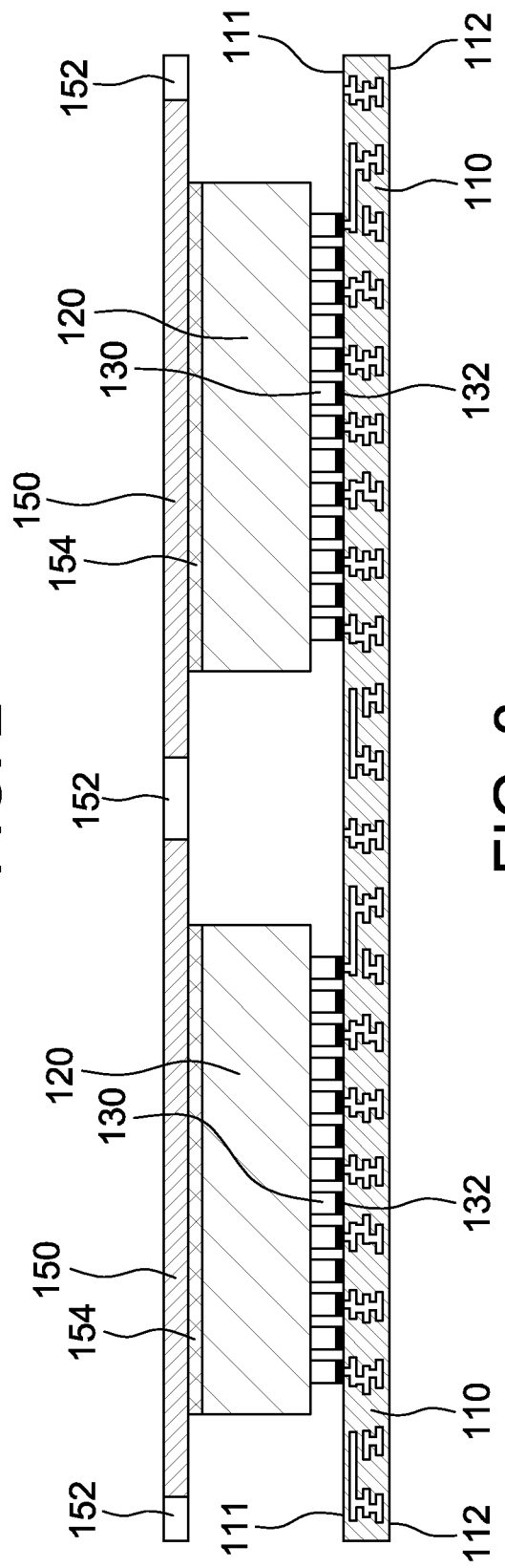

Referring to FIG. 3, a thermal interface material 154 is applied to the first surfaces of the dies 120 and a plurality of heat spreaders 150 is then disposed on the dies 120 respectively, such that the thermal interface material 154 are positioned between the heat spreaders 150 and the dies 120. The heat spreaders 150 are polygonal and respectively have opposing first surfaces and second surfaces, wherein the second surfaces of the heat spreaders 150 respectively face the first surfaces of the dies 120. The each heat spreader 150 extends beyond the periphery of the die 120 directly below it. The heat spreaders 150 are respectively provided with a plurality of through holes 152 formed thereon.

As shown in FIG. 4, the aforementioned dies 120 provided with the heat spreaders 150 are placed in a mold (not shown in the figure) and the molding material is then poured into the mold thereby forming a molding layer 170 between the heat spreaders 150 and the redistribution layer 110 to cover the side surfaces of the dies 120. The molding material not only covers the sides of the dies 120 and is cured and formed on the first surfaces of the heat spreaders 150, but also fills the through holes 152 on the heat spreaders 150.

Referring to FIG. 5, the aforementioned structure containing the molding layer 170 is then taken out of the mold, and the excess molding material on the first surfaces of the heat spreaders 150 is ground off. Afterwards, a metal layer 160 is coating as a protective layer on the first surfaces of the heat spreaders 150 to protect the heat spreaders 150 from rust (as shown in FIG. 6).

Referring to FIG. 7, the aforementioned structure is turned upside down, and a mask 180 is then formed on the second surface 112 of the redistribution layer 110. Afterwards, a plurality of openings 182 corresponding to the conductive traces embedded in the redistribution layer 110 are formed on the mask 180.

Referring to FIG. 8, the portions of the polyimide on the redistribution layer 110 that is not covered by the mask 180, that is, the portions exposed in the openings 182, are removed by a process of chemical or plasma etching so that the conductive traces in the redistribution layer 110 originally covered by the polyimide are exposed.

Referring to FIG. 9, the mask 180 is then removed, and a plurality of conductive bumps 140 are formed on the second surface 112 of the redistribution layer 110 and electrically connected to the conductive traces in the redistribution layer 110. Afterwards, the molding layer 170 and the redistribution layer 110 are divided to form a plurality of semiconductor packages as shown in FIG. 1.

In the manufacturing method of the semiconductor package of the present disclosure, the thermal interface material 154 is used to connect the heat spreader 150 to the die 120. The molding layer 170 is formed to encapsulate the die 120 on the redistribution layer 110 by molding process so that the overall structure of the semiconductor package may stay stable. Since the molding layer 170 is formed by molding process, the molding material will also be molded on the first surface of the heat spreader 150 in the molding process. Therefore, a grinding process is subsequently performed to remove the excess molding material to expose the first surface of the heat spreader 150 so that the heat spreader 150 may better dissipate the heat generated by the die 120. The metal layer 160 coated on the first surface of the heat spreader 150 serves as a protective layer to protect the heat spreader 150 from rust. The molding layer 170 is filled in the through holes 152 to make the heat spreader 150 adhere to the die 120 more firmly. In addition, the redistribution layer 110 may be opened by means of chemical or plasma etching, which may save the time spent by laser drilling.

Although the preferred embodiments of the disclosure have been disclosed for illustrative purposes, those skilled in the art will appreciate that various modifications, additions and substitutions are possible, without departing from the scope and spirit of the disclosure as disclosed in the accompanying claims.

What is claimed is:

1. A method of manufacturing a semiconductor package, comprising:
   providing a redistribution layer having opposing first surface and second surface;
   disposing a die on the first surface of the redistribution layer and electrically connecting the die to the redistribution layer;
   applying a thermal interface material on the die;
   disposing a heat spreader on the die such that the thermal interface material is positioned between the heat spreader and the die;
   forming a molding layer, with a molding material, on the redistribution layer to cover side surfaces of the die;
   removing the molding material on the heat spreader thereby exposing the heat spreader; and
   coating a metal layer as a protective layer on the heat spreader.

2. The method as claimed in claim 1, further comprising:
   forming a mask on the second surface of the redistribution layer;
   performing a chemical or plasma etching process on the second surface of the redistribution layer to expose conductive traces in the redistribution layer;
   removing the mask; and
   forming a plurality of conductive bumps on the second surface of the redistribution layer and electrically connecting the conductive bumps to the exposed conductive traces in the redistribution layer.

3. The method as claimed in claim 1, wherein the thermal interface material is in direct contact with the heat spreader and the die.

4. The method as claimed in claim 1, wherein the heat spreader is provided with a plurality of through holes formed thereon, the molding material being further filled in the through holes of the heat spreader.

5. The method as claimed in claim 1, wherein the heat spreader extends beyond periphery of the die.

6. The method as claimed in claim 5, wherein the molding layer is further formed between the heat spreader and the redistribution layer.

\* \* \* \* \*